United States Patent
Fan

(10) Patent No.: US 9,837,385 B1
(45) Date of Patent: Dec. 5, 2017

(54) SUBSTRATE-LESS PACKAGE STRUCTURE

(71) Applicant: POWERTECH TECHNOLOGY INC., Hsinchu County (TW)

(72) Inventor: Wen-Jeng Fan, Hsinchu County (TW)

(73) Assignee: POWERTECH TECHNOLOGY INC., Hsinchu County (TW)

( * ) Notice: Subject to any disclaimer, the term of this patent is extended or adjusted under 35 U.S.C. 154(b) by 0 days.

(21) Appl. No.: 15/461,453

(22) Filed: Mar. 16, 2017

(51) Int. Cl.
*H01L 23/34* (2006.01)
*H01L 21/00* (2006.01)
*H01L 25/065* (2006.01)
*H01L 23/31* (2006.01)
*H01L 23/00* (2006.01)
*H01L 25/00* (2006.01)
*H01L 21/56* (2006.01)

(52) U.S. Cl.
CPC .......... *H01L 25/0657* (2013.01); *H01L 21/56* (2013.01); *H01L 21/565* (2013.01); *H01L 21/568* (2013.01); *H01L 23/3142* (2013.01); *H01L 24/02* (2013.01); *H01L 24/16* (2013.01); *H01L 24/32* (2013.01); *H01L 24/48* (2013.01); *H01L 24/81* (2013.01); *H01L 24/83* (2013.01); *H01L 24/85* (2013.01); *H01L 25/50* (2013.01); *H01L 24/49* (2013.01); *H01L 2224/32145* (2013.01); *H01L 2225/06506* (2013.01); *H01L 2225/06513* (2013.01)

(58) Field of Classification Search
CPC .............. H01L 25/0657; H01L 21/565; H01L 23/3142; H01L 24/02; H01L 24/32; H01L 24/48; H01L 24/81; H01L 24/83; H01L 24/85; H01L 25/50; H01L 21/568; H01L 21/56; H01L 24/17; H01L 24/49
See application file for complete search history.

(56) References Cited

U.S. PATENT DOCUMENTS

| 5,869,905 | A | * | 2/1999 | Takebe | H01L 21/4832 257/780 |
| 7,745,918 | B1 | | 6/2010 | Woodyard | |
| 8,716,070 | B2 | | 5/2014 | Chiu | |
| 8,836,114 | B2 | * | 9/2014 | Oh | H01L 21/561 257/734 |
| 2005/0052830 | A1 | * | 3/2005 | Bauer | H01L 24/97 361/679.02 |
| 2011/0084402 | A1 | * | 4/2011 | Jeung | H01L 21/4853 257/774 |
| 2012/0241982 | A1 | * | 9/2012 | Jeung | H01L 21/4853 257/777 |
| 2013/0320463 | A1 | | 12/2013 | Chang | |

* cited by examiner

*Primary Examiner* — Alonzo Chambliss
(74) *Attorney, Agent, or Firm* — Winston Hsu

(57) ABSTRACT

A package includes a chip, a wire, a mold layer and a redistribution layer. The chip includes a conductive pad. The wire is bonded to the conductive pad of the chip. The mold layer surrounds the first chip and the wire. The redistribution layer is disposed on the mold layer and contacts an exposed portion of the wire.

13 Claims, 11 Drawing Sheets

SUBSTRATE-LESS PACKAGE STRUCTURE

BACKGROUND OF THE INVENTION

1. Field of the Invention

The present invention relates to a substrate-less package with low profile.

2. Description of the Prior Art

In the field of packaging process, size is a highly concerned feature of a product. When a packaged integrated-circuit (IC) chip has a smaller size, it is easier to embed the packaged chip into an end product (e.g. a mobile phone or an electrical instrument). Hence, a smaller size improves the competitiveness of the product.

Some packaging processes have been used to reduce the size of a package. For example, PoP (package-on-package) process may be used to combine two or more packaged chips vertically by stacking the packaged chips via a ball grid array (BGA). A plurality of packages can therefore be integrated into one package so as to reduce their size and lower the complexity of circuitry. However, it is still difficult to reduce the thickness of a package. Since a PoP structure includes at least two packages stacking onto one another, a common problem is that the thickness of a PoP structure is too large and difficult to be reduced. For applications such as mobile devices, a large PoP structure may be difficult to be embedded in a small sized device. Hence, a solution for reducing the thickness of a package structure is required in the field.

SUMMARY OF THE INVENTION

An embodiment provides a package. The package may include a chip, a wire, a mold layer and a redistribution layer. The chip may have a conductive pad. The wire may be bonded to the conductive pad of the chip. The mold layer may surround the chip and the wire. The redistribution layer may be disposed on the mold layer, and contact an exposed portion of the wire.

Another embodiment provides a package structure. The package structure may include a first package and a second package. The first package may include a chip, a wire, a mold layer, a redistribution layer, and a conductive ball. The chip may include a conductive pad. The wire may be bonded to the conductive pad of the chip. The mold layer may surround the chip and the wire. The redistribution layer may be disposed on the mold layer, and contact an exposed portion of the wire. The conductive ball may be soldered on the redistribution layer. The second package may include a conductive interface contacting the conductive ball of the first package.

Another embodiment provides a packaging method. The packaging method may include disposing a chip on a carrier; bonding a wire to a conductive pad of the chip; filling a molding material to form a mold layer surrounding and covering the chip and the wire, the mold layer comprising a first side and a second side, the second side contacting the carrier; removing the carrier; thinning the mold layer from the first side of the mold layer until exposing the wire; and disposing a redistribution layer on the first side of the mold layer, the redistribution layer contacting an exposed portion of the wire. The chip, the wire, the mold layer and the redistribution layer belong to a package.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
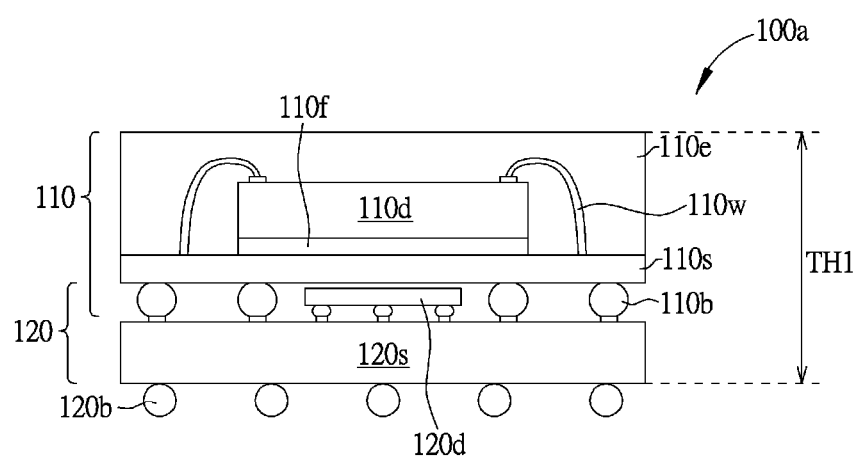
FIG. 1 package structure according to an embodiment of the present invention.

FIG. 1 illustrates a package structure 100a according to an embodiment of the present invention. The package structure 100a may be a PoP structure, and include a first package 110 and a second package 120. The first package 110 may include a first chip 110d, an adhesive layer 110f, wires 110w, a mold layer 110e, a first substrate layer 110s and conductive balls 110b. The second package 120 may include a second chip 120d, a second substrate layer 120s and conductive balls 120b. The package structure 100a may be a workable PoP structure, however, at least two substrate layers (e.g. 110s and 120s) may be used in the package structure 100a, and the thickness TH1 of the package structure 100a may include the thicknesses of the two substrate layers 110s and 120s.

Figure 2:
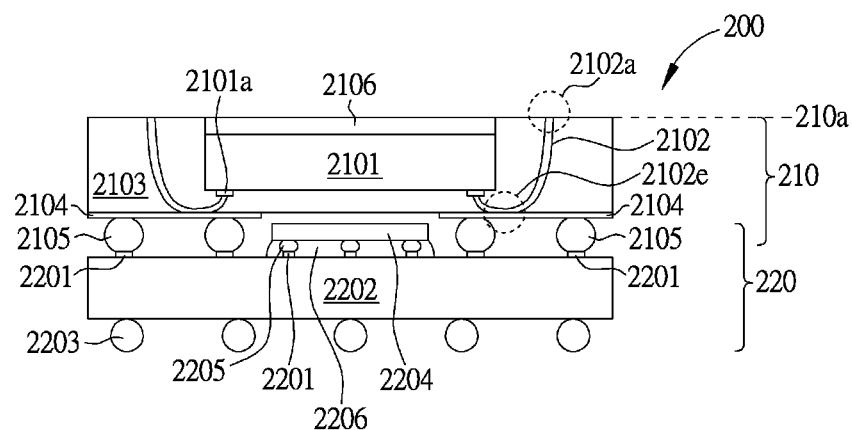
FIG. 2 illustrates a package structure according to an embodiment of the present invention.

FIG. 2 illustrates a package structure 200 according to an embodiment of the present invention. The package structure 200 may include a first package 210 and a second package 220. The first package 210 may include a chip 2101, wires 2102, a mold layer 2103, a redistribution layer (RDL) 2104, and conductive balls 2105. The chip 2101 may include conductive pads 2101a. The wires 2102 may be bonded to corresponding conductive pads 2101a of the chip 2101. The mold layer 2103 may encapsulate the chip 2101 and the wires 2102. The redistribution layer 2104 may be disposed on the mold layer 2103. The redistribution layer 2104 may be electrically coupled to exposed portions 2102e of the wires 2102. After bonding the wire 2102, a loop structure may be formed and a loop height is generated. When coupling the wire 2102 to the chip 2101 and a carrier 488 (shown in FIG. 6), the wire 2102 may be bonded to the chip 2101 to form a first bond, and pulled to a desired location of the carrier 488, and bonded to the location to form a second bond. When pulling the wire 2102 to the desired location, an action referred to as 'looping' may be performed to feed the wire 2102 between the first bond and the second bond so that the wire 2102 may take a form of an arc. The arc formed when a bonding tool traveled in a natural parabolic or elliptic curve may be called as a 'wire loop'. The wire loop is characterized by its shape, length and height, and all of these may define the 'loop profile' of the wire. Regarding FIG. 2, The exposed portions 2012e may be the loop portion of the wires 2012. The height of the mold layer 2103 may be substantially the same as the loop height of the bonded wires 2012.

The conductive ball 2105 may be soldered on the redistribution layer 2104. The second package 220 may include conductive interfaces 2201. The conductive interfaces 2201 may contact corresponding conductive balls 2105 of the first package 210 for sending and/or receiving signals and data between the first package 210 and the second package 220. Since a terminal 2102a of each of the wires 2102 is exposed on a side 210a of the first package 210 and the terminal 2102a may be electrically coupled to the chip 2101, a third semiconductor package may optionally be disposed on the side 210a of the first package 210. The terminal 2102a of each of the wires 2102 may be used to electrically couple to third package to the first package 210. For example, each of the connecting terminals of the third package may be directly coupled to a terminal 2102a of a wire 2102. Or, a redistribution layer electrically connected to the terminals 2102a may be formed on the side 210a of the first package 210 and each of the connecting terminals of the third package may be correspondingly electrically coupled to a terminal 2102a of a wire 2102 through the redistribution layer.

As shown in FIG. 2, the second package 220 may further include a chip 2204, a substrate layer 2202, conductive balls 2203, a mold layer 2206, and conductive balls 2205 between the chip 2204 and the substrate layer 2202. The substrate layer 2202 may have a designed circuitry. The substrate layer 2202 may have a multi-layer structure. The redistribution layer 2104 may be designed and routed to form a circuitry. The chip 2204 may have pads connected to the conductive balls 2205. Each of the conductive balls 2205 may contact a corresponding conductive interface 2201 of the substrate layer 2202 to form a data path between the chip 2204 and the substrate layer 2202.

The circuitry formed by the redistribution layer 2104 and the circuitry of the substrate layer 2202 may be designed according to application or product specification. Hence, data and signals may be transmitted and received between the chip 2101 and the chip 2204 via the conductive pads 2101a, the exposed portions 2102e of the wires 2102, the redistribution layer 2104, the conductive balls 2105, the conductive interfaces 2201, the substrate layer 2202 and the conductive balls 2205 connecting the chip 2204. In other words, communication paths may be formed and used via the exposed portions 2102e of the wires 2102.

According to an embodiment of the present invention, the first package 210 may include an adhesive layer 2106 adhered to the first chip 2101. The mold layer 2103 and the mold layer 2206 may be formed by using a suitable material such as (but not limited to) epoxy molding compound (EMC) or another sort of resin according to an embodiment of the present invention. The conductive balls 2203 may be used to contact an external circuit such as an external PCB.

Figure 3:
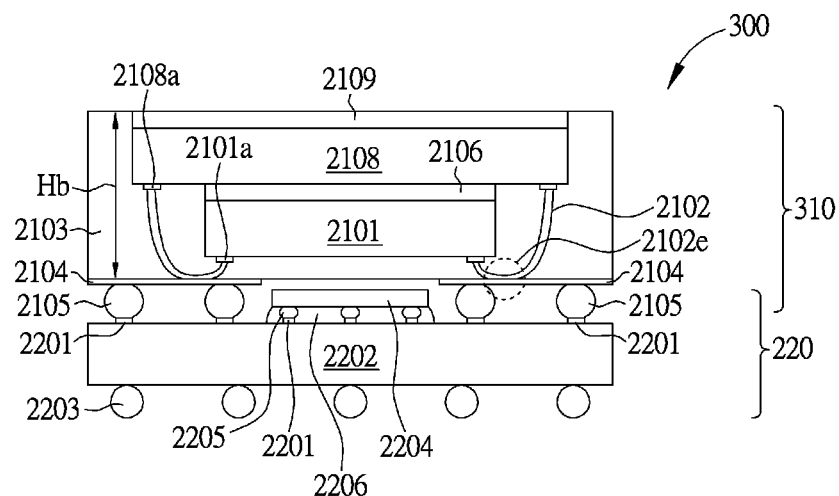
FIG. 3 illustrates a package structure according to an embodiment of the present invention.

FIG. 3 illustrates a package structure 300 according to an embodiment of the present invention. The package structure 300 may be similar to the package structure 200 and include a first package 310 and a second package 220. Comparing with the first package 210 of FIG. 2, the first package 310 of FIG. 3 may further include a chip 2108. The chip 2108 may include conductive pads 2108a. In addition to being bonded to the conductive pads 2101a of the chip 2101, the wires 2102 in FIG. 3 may also be bonded to corresponding conductive pads 2108a of the chip 2108. Hence, in the example of FIG. 3, data and signals may be transmitted among the chip 2101, the chip 2108 and the chip 2204 via the exposed portions 2102e of the wires 2102e. In the above description, a plurality of wires 2102 are used to explain how the package structures 200, 300 operate. However, the package structures 200, 300 may have only a single wire with an exposed portion for implementing the operation of the package structures 200, 300. As shown in FIG. 3, an adhesive layer 2109 may be adhered to the chip 2108 to protect and fix the chip 2108, and the adhesive layer 2109 may be (but not limited to) a chip attach film. Each of the packages 210 and 310 may be referred to as a top package. A top package may include one, two or even more chips according to embodiments of the present invention. In FIG. 3, a thickness Hb may be merely 150-200 um. The mold layer of a top package of a conventional PoP structure may be around 350 um, so the thickness of a top package (without its conductive ball) may be reduced to be 42.8% to 57.1% of the thickness of the prior art. In addition, as shown in FIG. 2 and FIG. 3, the package structure 200 or 300 may include merely one substrate layer, that is the substrate layer 2202. However, the package structure 100a of FIG. 1 may include two substrates 110s and 120s. Hence, the thickness of the package structures 200 and 300 may be further reduced as compared to the package structure 100a. Hence, a super thin PoP structure may be obtained according to an embodiment of the present invention. In FIG. 3, the exposed portions 2102e may be electrically connected to the conductive pads 2101a so that the connected conductive balls 2105 may be coupled to the chip 2101. In another example, the exposed portions 2102e may be electrically connected to the conductive pads 2101a and 2108a so that the connected conductive balls 2105 may be coupled to the chips 2101 and 2108.

Figure 4:
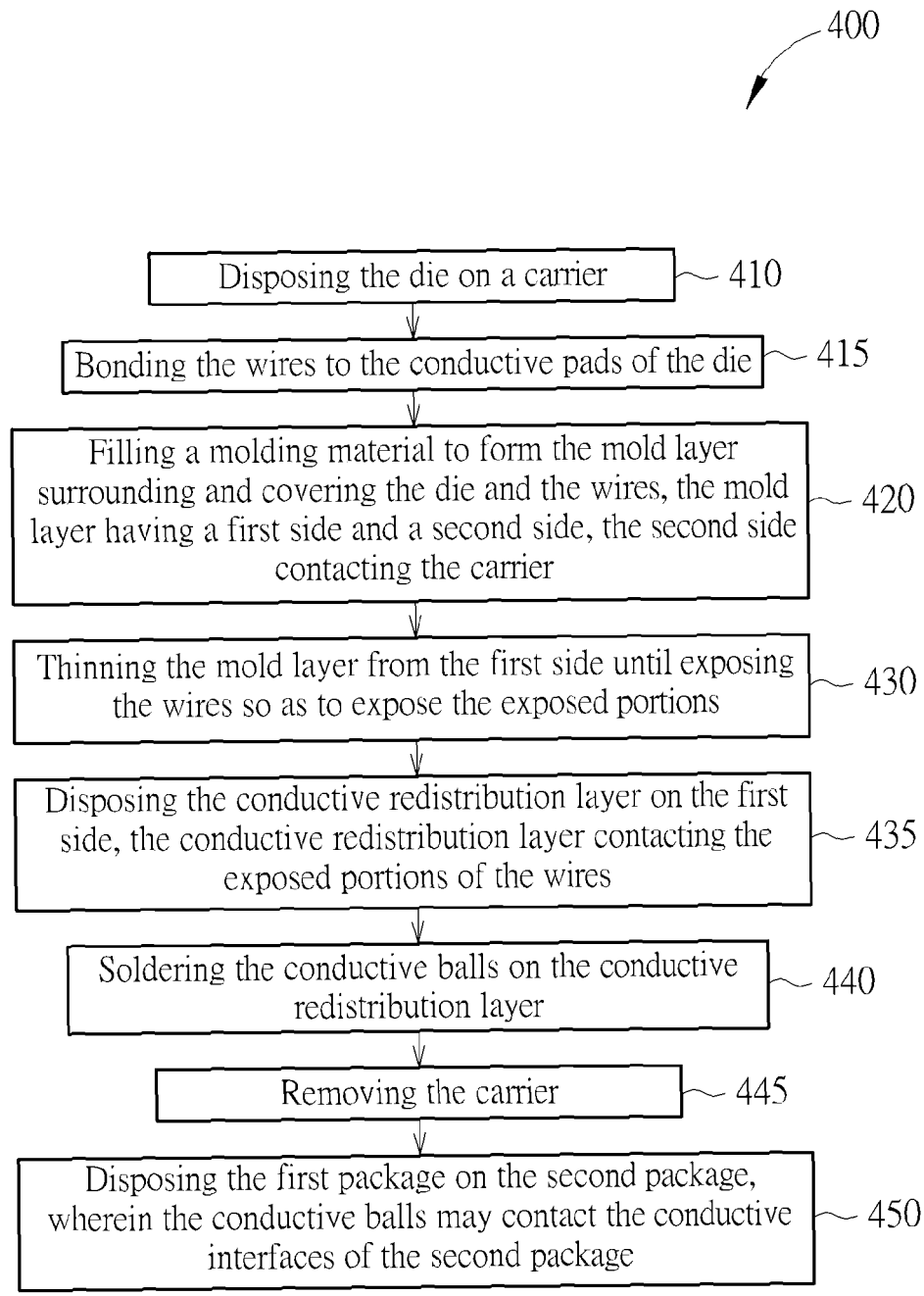
FIG. 4 illustrates a flowchart of a packaging method according to an embodiment of the present invention.

FIG. 4 illustrates a flowchart of a packaging method 400 according to an embodiment of the present invention. The packaging method 400 may be used to generate the package structure 200. The packaging method 400 may include:

Step 410: disposing the chip 2101 on a carrier 488;

Step 415: bonding the wires 2102 to the conductive pads 2101a of the chip 2101;

Step 420: filling a molding material to form the mold layer 2103 surrounding and covering the chip 2101 and the wires 2102, the mold layer 2103 having a first side 21031 and a second side 21032, the second side 21032 contacting the carrier 488;

Step 430: thinning the mold layer 2103 from the first side 21031 until exposing the wires 2102 so as to expose the exposed portions 2102e; Step 435: disposing the redistribution layer 2104 on the first side 21031, the redistribution layer 2104 contacting the exposed portions 2102e of the wires 2102;

Step 440: soldering the conductive balls 2105 on the redistribution layer 2104;

Step 445: removing the carrier 488; and

Step 450: disposing the first package 210 on the second package 220 (as shown in FIG. 1), wherein the conductive balls 2105 may contact the conductive interfaces 2201 of the second package 220.

FIG. 5 to FIG. 11 and FIG. 2 illustrate package structure during the process corresponding to Steps 410 to 450 of FIG. 4 respectively. FIGS. 5-11 illustrate the process of generating the top package 210 of the package structure 200 of FIG. 2.

Figure 6:
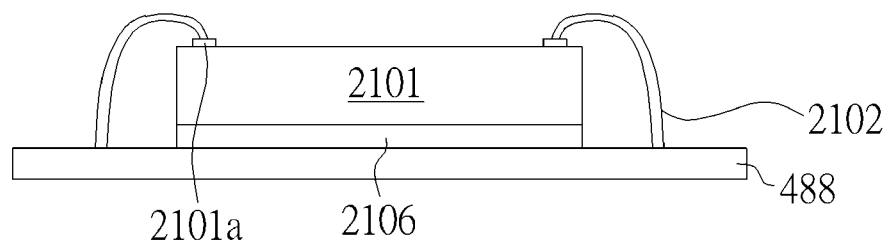
Figure 7:
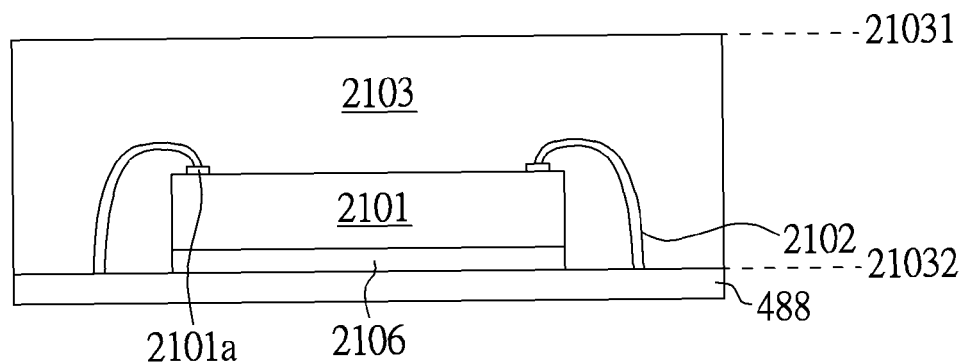
Figure 8:
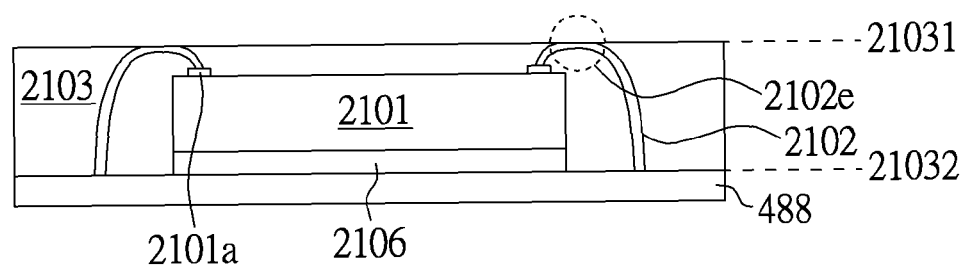
Figure 9:
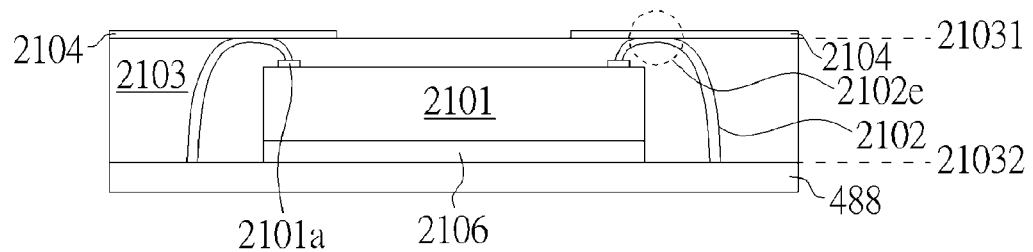
Figure 10:
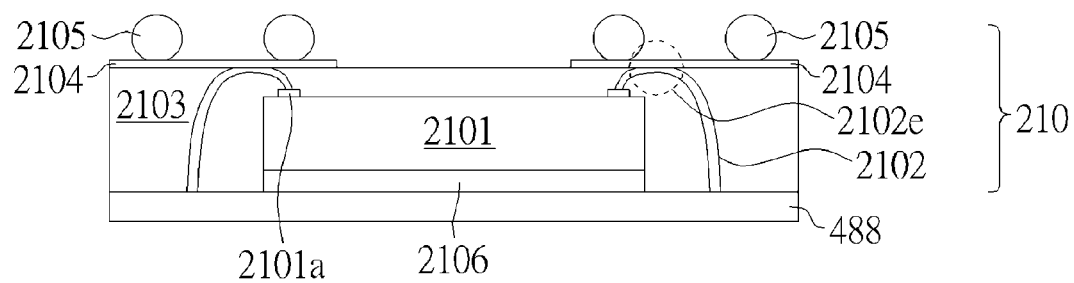
Figure 11:
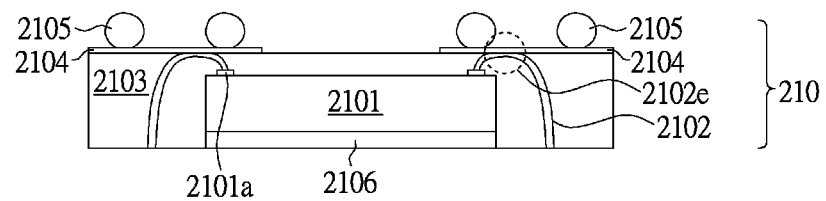

In Step 415, the wires 2102 may be bonded to the conductive pads 2101a and the carrier 488 as shown in the example of FIG. 6. A suitable intermediary material may be used for fixing the wires 2102 on the carrier 488. In Step 450, the top package 210 may be flipped so that the conductive balls 2105 may be soldered onto the conductive interfaces 2201 so as to form transmission paths between the two packages 210 and 220.

Figure 12:
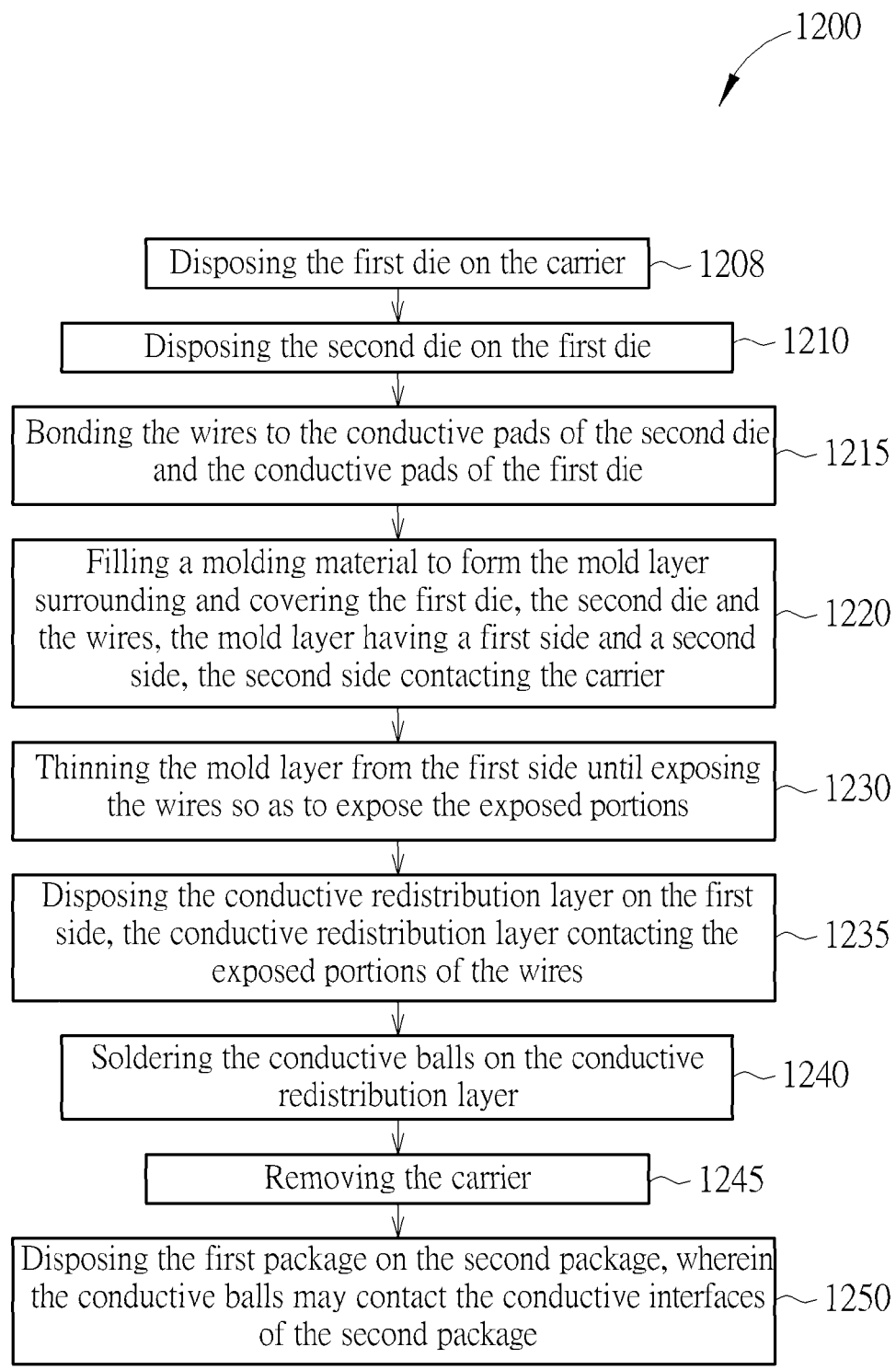
FIG. 12 illustrates a flowchart of a packaging method 1200 according to an embodiment of the present invention.

FIGS. 5-11 may be used to generate a top package having merely only one chip. However, according to another embodiment of the present invention, the top package may include more than one chip such as FIG. 3. FIG. 12 illustrates a flowchart of a packaging method 1200 to dispose more than one chip in a top package according to an embodiment of the present invention. The packaging method 1200 may include:

Step 1208: disposing the chip 2108 on the carrier 488;
Step 1210: disposing the chip 2101 on the chip 2108;
Step 1215: bonding the wires 2102 to the conductive pads 2101a of the chip 2101 and the conductive pads 2108a of the chip 2108;
Step 1220: filling a molding material to form the mold layer 2103 surrounding and covering the chip 2101, the chip 2108 and the wires 2102, the mold layer 2103 having a first side 21031 and a second side 21032, the second side 21032 contacting the carrier 488;
Step 1230: thinning the mold layer 2103 from the first side 21031 until exposing the wires 2102 so as to expose the exposed portions 2102e;
Step 1235: disposing the redistribution layer 2104 on the first side 21031, the redistribution layer 2104 contacting the exposed portions 2102e of the wires 2102;
Step 1240: soldering the conductive balls 2105 on the redistribution layer 2104;
Step 1245: removing the carrier 488; and
Step 1250: disposing the first package 310 on the second package 220 (as shown in FIG. 3), wherein the conductive balls 2105 may contact the conductive interfaces 2201 of the second package 220.

Figure 5:
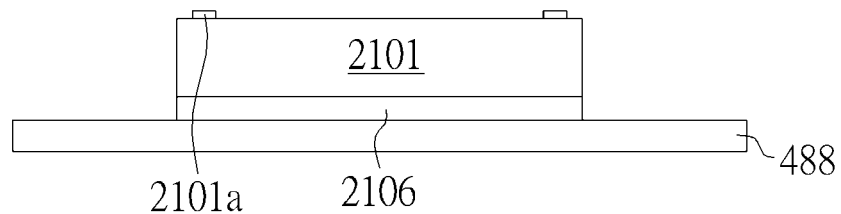
FIG. 5 to FIG. 11 illustrate the process of generating the top package of the package structure of FIG. 2.
Figure 13:
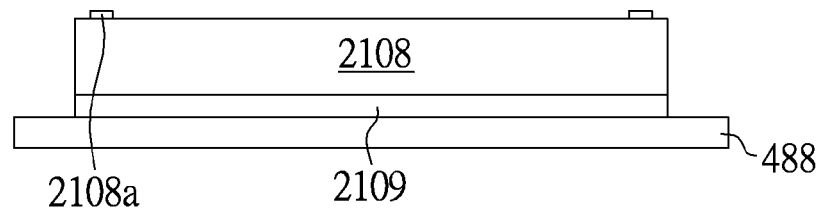
FIG. 13 to FIG. 18 illustrate the process of generating the top package of the package structure of FIG. 3.
Figure 14:
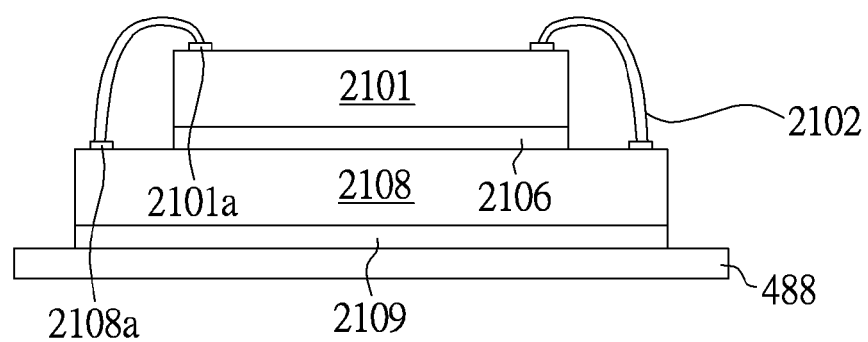
Figure 15:
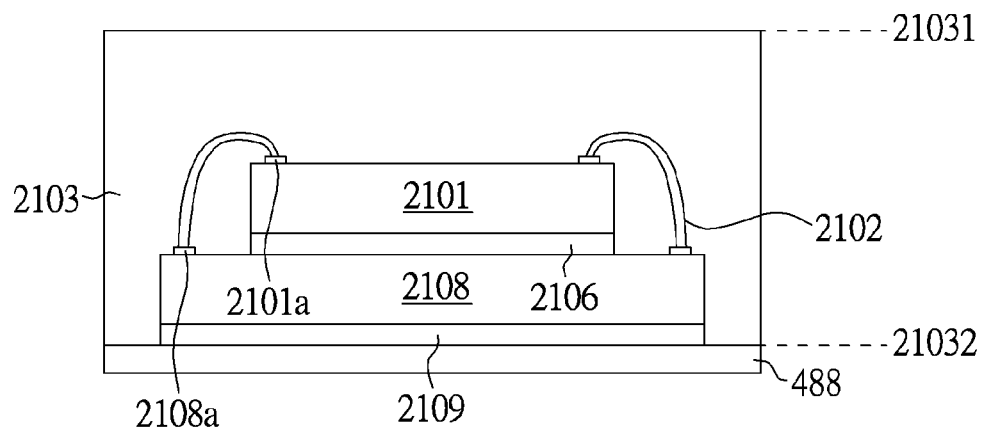
Figure 16:
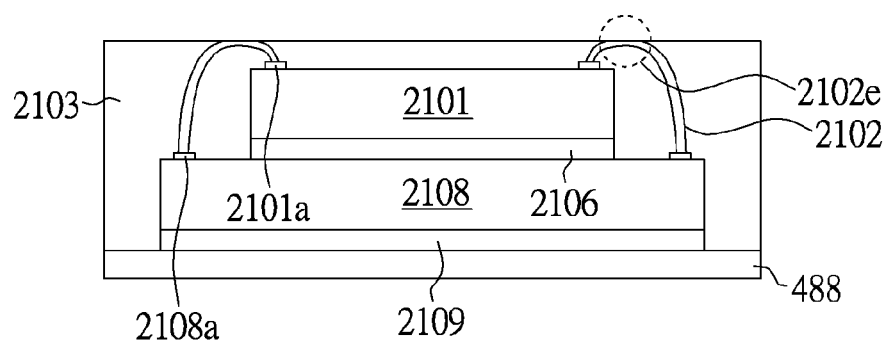
Figure 17:
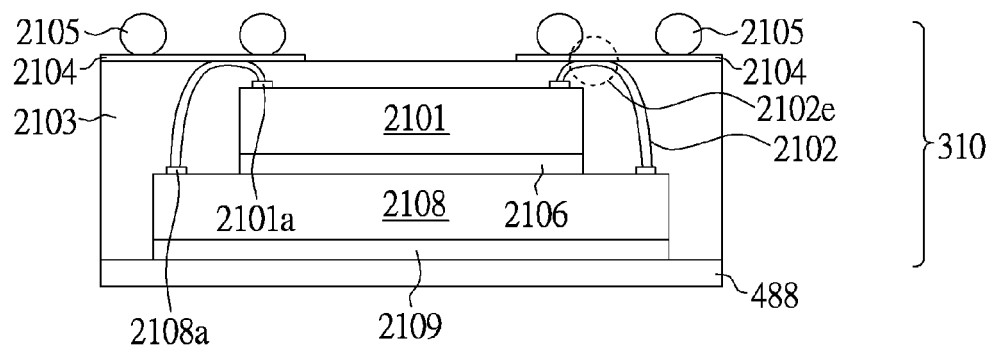
Figure 18:
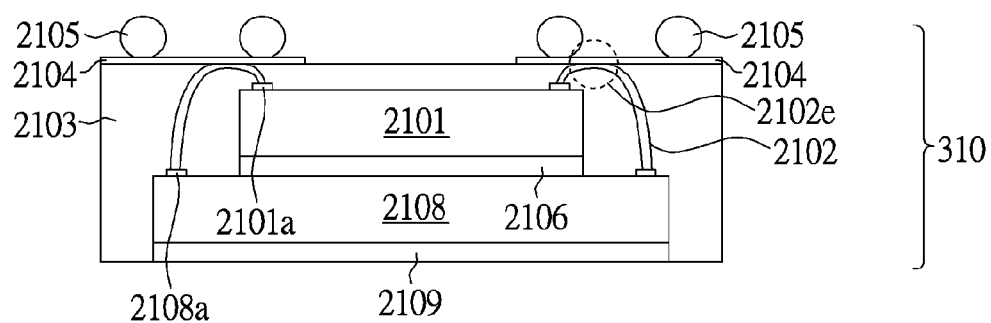

FIGS. 13-18 illustrate the process of generating the top package 310 of the package structure 300 of FIG. 3. FIGS. 13-14 may correspond to Steps 1208, 1210 and 1215. As shown in FIG. 14, when a top package (e.g. the top package 310) has two chips (e.g. the chips 2108 and 2101), the wires 2102 may be further bonded to the conductive pads 2108a of the chip 2108 in addition to the conductive pads 2101a of the chip 2101 so as to form transmission paths between the chips 2101 and 2108. FIG. 15 may correspond to Step 1220. FIG. 16 may correspond to Step 1230. FIG. 17 may correspond to Steps 1235 and 1240. FIG. 18 may correspond to Step 1245. FIG. 3 may correspond to Step 1250. In Steps 445 and 1245, the carrier 488 may be removed by grinding, etching or/and peeling off the carrier 488. In Steps 430 and 1230, the mold layer 2103 may be thinned by grinding the mold layer 2103. The carrier 488 may act as a base element for the chip(s) and the mold layer 2103 to be formed on it, and the carrier 488 may be removed afterward. The carrier 488 may be formed with glass, ceramic, plastic, and/or other appropriate materials. As shown in FIG. 5, the adhesive layer 2106 adhered between the chip 2101 and the carrier 488 may be disposed between the chip 2101 and the carrier 488. For example, an adhesive film (e.g. chip attach film) may be adhered to a not-diced wafer bearing the chip 2101, and the chip 2101 may be adhered by a piece of adhered film that is the adhesive layer 2106 after the wafer is diced. Similarly, according to the embodiment of FIG. 13 to 17, the adhesive layer 2106 may be disposed between the chips 2101 and 2108, and the adhesive layer 2109 may be disposed between the chip 2108 and the carrier 488 for better reliability.

In summary, according to the package (e.g. 210 and 310), the methods (e.g. 400 and 1200) and the package structures (e.g. 200 and 300) provided by embodiments of the present invention, a super thin PoP structure with low profile may be manufactured by reducing the thickness of the PoP structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A package comprising:
a first chip comprising a conductive pad;
a wire bonded to the conductive pad of the first chip;
a mold layer encapsulating the first chip and the wire;
a redistribution layer disposed on the mold layer, and coupled to an exposed portion of the wire;
a second chip stacked on the first chip and comprising an conductive pad, wherein the mold layer further encapsulating the second chip, and the wire is further bonded to the conductive pad of the second chip;
a first adhesive layer adhered between the first chip and the second chip; and
a second adhesive layer adhered to the second chip.

2. The package of claim 1, wherein the first adhesive layer is a first chip attach film, and the second adhesive layer is a second chip attach film.

3. A package structure comprising:
a first package comprising:
a first chip comprising a conductive pad;
a wire bonded to the conductive pad of the first chip;
a mold layer surrounding the first chip and the wire;
a redistribution layer disposed on the mold layer, and contacting an exposed portion of the wire;
a second chip disposed next to the first chip, the second chip comprises a conductive pad, and the wire is further bonded to the conductive pad of the second chip;
a first adhesive layer adhered between the first chip and the second chip, and a second adhesive layer adhered to the second chip; and
a conductive ball soldered on the redistribution layer; and
a second package comprising a conductive interface contacting the conductive ball of the first package.

4. The package structure of claim 3, wherein the first adhesive layer is a chip attach film.

5. A packaging method comprising:
disposing a first chip on a carrier;
bonding a wire to a conductive pad of the first chip;
filling a molding material to form a mold layer encapsulating the first chip and the wire, the mold layer comprising a first side and a second side, the second side contacting the carrier;
removing the carrier;
thinning the mold layer from the first side of the mold layer until a portion of the wire is exposed; and
disposing a redistribution layer on the first side of the mold layer, the redistribution layer contacting the portion of the wire exposed on the mold layer;
wherein the first chip, the wire, the mold layer and the redistribution layer belong to a first package.

6. The method of claim 5, further comprising:
soldering a conductive ball on the redistribution layer; and
disposing the first package on a second package;
wherein the conductive ball contacts a conductive interface of the second package.

7. The method of claim 5, further comprising:
disposing an adhesive layer adhered between the first chip and the carrier.

8. The method of claim 5, further comprising:
disposing a second chip between the carrier and the first chip;
wherein the wire is further bonded to a conductive pad of the second chip.

9. The method of claim 8, further comprising:
disposing a first adhesive layer adhered between the first chip and the second chip; and
disposing a second adhesive layer adhered between the second chip and the carrier.

10. The method of claim 5, wherein the mold layer is thinned by grinding the mold layer.

11. The method of claim 5, wherein removing the carrier comprises grinding, etching or/and peeling off the carrier.

12. The method of claim 5, wherein disposing the redistribution layer on the first side of the mold layer comprises:
routing the redistribution layer to form a circuitry; and
disposing the routed redistribution layer on the first side of the mold.

13. The method of claim 5, the carrier is formed with glass, ceramic, and/or plastic.

\* \* \* \* \*